United States Patent
Kashyap et al.

[11] Patent Number: 5,822,511
[45] Date of Patent: Oct. 13, 1998

[54] SMART COMPARE TOOL AND METHOD

[75] Inventors: Praveen Kashyap, Tempe; Michael E. Stanley, Mesa, both of Ariz.

[73] Assignee: Motorola, Inc., Schaumburg, Ill.

[21] Appl. No.: 706,889

[22] Filed: Sep. 3, 1996

[51] Int. Cl.$^6$ .................................................. G06B 11/00
[52] U.S. Cl. ............................... 395/182.06; 395/183.14; 395/185.06; 395/500; 364/474.24
[58] Field of Search ......................... 395/182.06, 183.14, 395/185.01, 500, 185.06, 919, 922, 704, 712; 364/488, 474.23, 474.24

[56] References Cited

U.S. PATENT DOCUMENTS

| | | | |
|---|---|---|---|
| 3,886,525 | 5/1975 | Brown et al. | 340/172.5 |
| 4,698,785 | 10/1987 | Desmond et al. | 364/900 |
| 5,155,837 | 10/1992 | Liu et al. | 395/500 |
| 5,392,386 | 2/1995 | Chalas | 395/155 |
| 5,432,795 | 7/1995 | Robinson | 371/19 |

*Primary Examiner*—Albert DeCady
*Assistant Examiner*—Pierre Eddy Elisca
*Attorney, Agent, or Firm*—Robert F. Hightower; Rennie William Dover

[57] ABSTRACT

A method for reducing programming or data errors generated by a new computer program or data set when the computer program updates or replaces an existing computer program. A set of baseline output records is generated by running the existing computer program on an input file (step 701). A set of revised output records is generated by running the new computer program with the input file (step 702). The baseline and revised output records are mapped to form an association between corresponding records (step 707). The associated records are compared using tolerance data stored in a control file to produce a plurality of difference records, a portion of which represents the programming or data errors (step 711). The difference records are examined to identify the portion of the difference records corresponding to the programming or data errors for editing the new computer program.

4 Claims, 5 Drawing Sheets

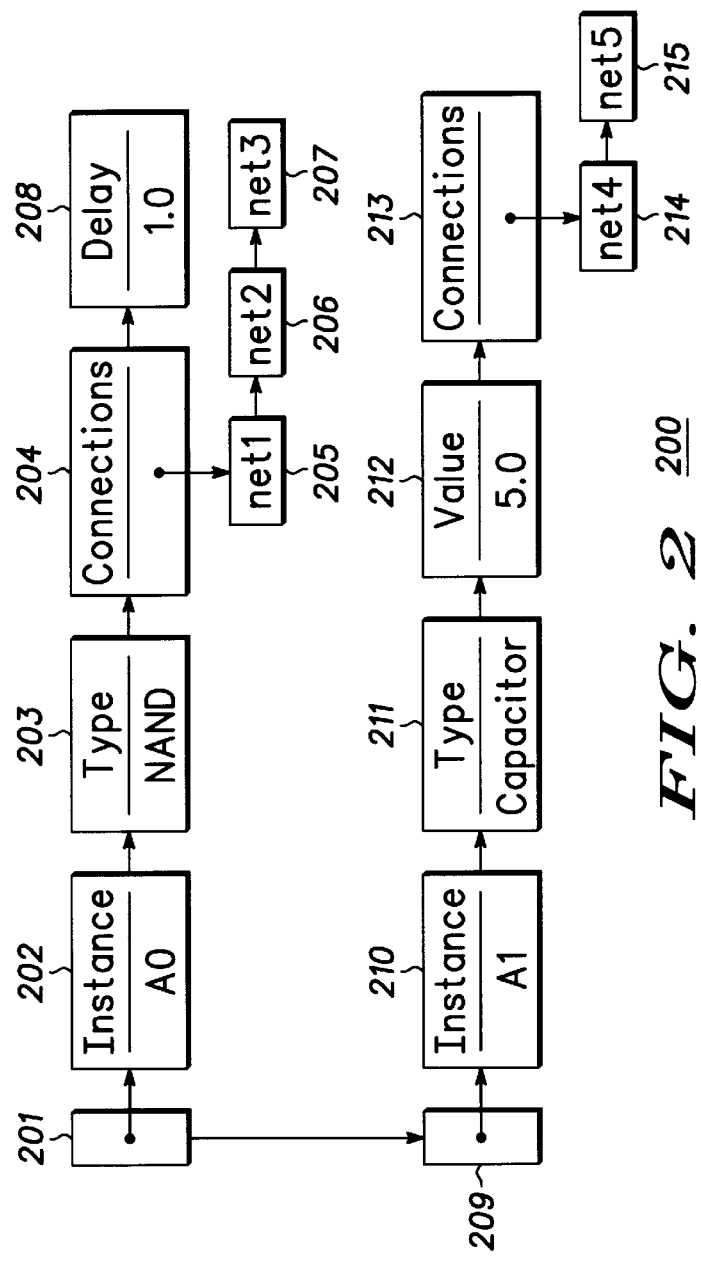

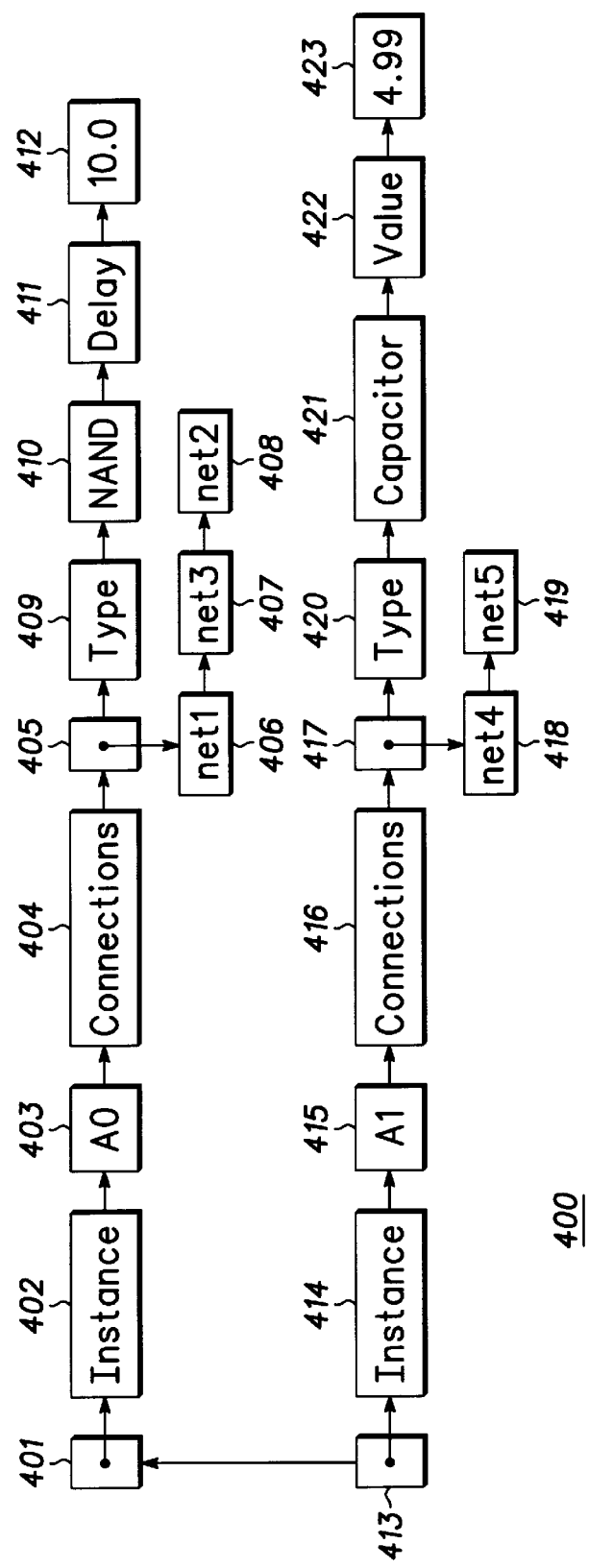

| 601 | List: Top->A0->Connections elements are different in file A:net2 and B:net3 |
| 602 | List: Top->A0->Connections elements are different in file A:net3 and B:net2 |
| 603 | Property: Top->A0->Delay has different values in file A:1.0 and B:10.0 |

FIG. 6    600

SMART COMPARE TOOL AND METHOD

BACKGROUND OF THE INVENTION

The present invention relates in general to computers and, more particularly, to reducing errors in computer systems.

Computer aided design (CAD) systems often consist of a set of independent programs which are run in sequence, transferring data between each other, to produce designs. For example, a silicon compiler is a CAD system for automating the task of designing complex integrated circuits to the highest degree possible. A silicon compiler typically produces data files for device, logic and circuit simulation as well as layout and test program generation. For a typical integrated circuit design, each program can produce thousands of records of output data which are transferred as input data to another program in the system.

These CAD programs must be regularly improved or revised to keep pace with technology, but the revisions may contain programming errors which, if undetected, result in design errors in an integrated circuit. Because of the complexity of a silicon compiler and the large amount of data produced, tracing the programming errors is a difficult task, particularly where each output record must be manually examined to determine if it contains erroneous data.

Because programming errors usually produce at least some output records which differ from output records produced by a working program, only the differences between the records produced by the revised and existing versions of the program need to be examined. To find any differences, the revised and existing programs are executed using the same input data. The output records are compared and a difference record is generated from the result of the comparison. The difference records are then manually examined by a programmer.

A method exists for comparing records from two files using a computer to perform a sequential record by record binary comparison of the baseline and revised records. However, the method is inadequate because it produces too many records with differences which are insignificant, such as round-off errors. Another known method uses a tolerance parameter to screen out some of the insignificant differences. However, the method has a limited usefulness in CAD programs because the records contain a mixture of data types, such as floating point, integer, string and list variables, each of which requires a different kind of screening criterion. Moreover, the method cannot determine when the sequence of the records or their hierarchical structure has changed. As a result, it finds too many differences because it compares records which do not correspond to each other.

Hence, there is a need for a method for reducing programming errors when a computer program is revised by intelligently comparing records respectively produced by the program and its revision to identify their differences. It would be a benefit if the method could screen out records having only insignificant differences. It would be yet a further benefit if the method could adapt when the revised program changed the sequence or the structure of output records it produced.

BRIEF DESCRIPTION OF THE DRAWINGS

FIG. 1 is a diagram of a data file containing records produced by a CAD program;

FIG. 2 is an unordered list showing a hierarchical structure of the data file of FIG. 1 after parsing;

FIG. 3 is a diagram of a data file containing records produced by a second CAD program;

FIG. 4 is an unordered list showing a hierarchical structure of the data file of FIG. 3 after parsing;

FIG. 6 is a difference file showing the results of comparing data fields from the ordered list of FIG. 2 with corresponding data fields from the ordered list of FIG. 4;

DETAILED DESCRIPTION OF THE DRAWINGS

Figure 5:
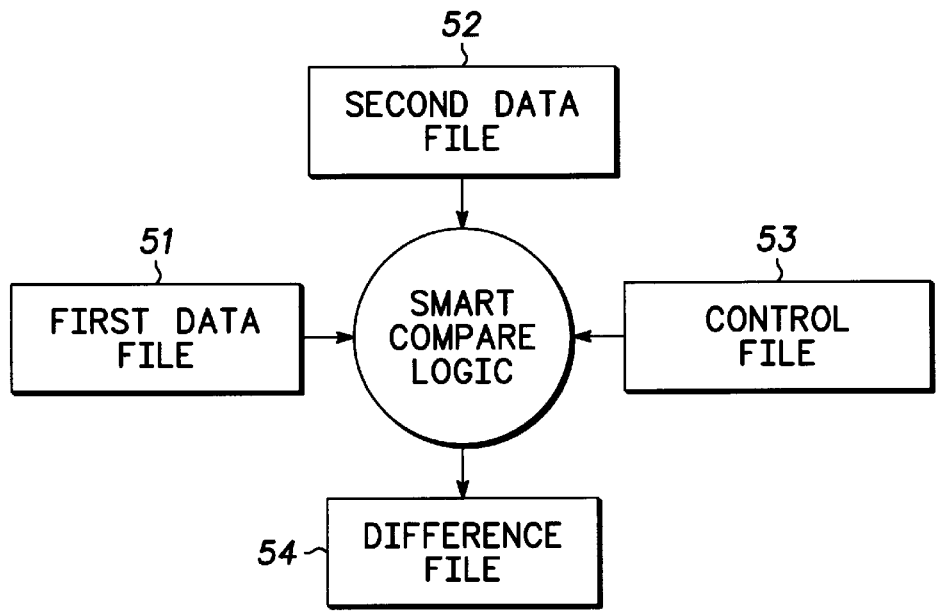
FIG. 5 is a diagram showing the data flow when a first data file is compared with a second data file in accordance with the present invention.

Many integrated circuits are so complex that their design would not be feasible unless it could be automated. A computer aided design (CAD) system is a set of integrated circuit design tools which provides the automation and data handling needed for designing these circuits. A typical CAD system receives input data from user in the form of a netlist or logic diagram. From this data and process characterization data provided by a manufacturer, the CAD system produces the coordinates of the shapes needed for generating individual mask layers used for fabricating the integrated circuit. The design procedure involves executing a number of independent programs which transfer among each other data which correspond to parameters of an integrated circuit being designed.

When one of the CAD programs is revised or replaced by a new CAD program, it can contain undetected programming errors which result in design errors in the integrated circuit. Similarly, revised input data such as circuit parametric data can contain undetected data errors which can also result in design errors in the integrated circuit The design errors are associated with differences between the respective output records produced by the revised and existing versions of the CAD program. Design errors can also be associated with differences between output files produced by running the CAD program using revised input data.

FIG. 1 is a diagram of data file 10 containing records 11 and 12 which are produced by a CAD program used to simulate a sample integrated circuit. By way of example, data file 10 consists of records produced by a existing version of a hypothetical CAD circuit simulation program. FIG. 2 is an unordered list 200 showing a graphical representation of a hierarchical structure of the data file 10 of FIG. 1 after it has been parsed into individual data fields 201 through 215.

Each data field contains a property value which typically represents a parameter of the integrated circuit being designed. Thus, data field 202 has a property value "A0" which represents the name of a corresponding element of the integrated circuit. Similarly, data field 203 has a property value "NAND," data field 205 has the property value "net1," data field 206 has the property value "net2," data field 207 has the property value "net3," data field 208 has the property value "1.0," data field 210 has the property value "A1," data field 211 has the property value "capacitor," data field 212 has the property value "5.0," data field 214 has the property value "net4," and data field 215 has the property value "net5." It should be apparent from FIG. 2 that numerous types of property values can be used in describing the data fields included in a particular data record. By way of example, property values can be string variables, floating point numbers, integers, and the like. The particular type of property value is typically indicated in the corresponding data field, but for clarity is not shown in FIG. 2.

Property values can also be lists which themselves comprise a plurality of data fields. Such lists can be property lists, simple ordered lists or simple unordered lists. A property list is one in which each data field consists of a property name/property value pair. A property name is a handle contained in a data field for facilitating the identification, storage or retrieval of the data field. Each data field in a property list can thus be retrieved by referring to its property name independently of its property value or its order in the property list. A simple ordered list is a collection of data fields containing unnamed property values in which the order is important. A simple unordered list is one in which the appearance of the data fields in the list is important but their order is not. In the hierarchical structure shown in FIG. 2, data field 201 has a property value which is a property list containing data fields 202, 203, 204 and 208. It is a property list because each of its data fields contains a property name. Thus, data field 202 has the property name "Instance," data field 203 has the property name "Type," and data field 208 has the property name "Delay." The property name of the data field 204 is "Connections." The property value of data field 204 is a simple ordered list containing the data fields 205 through 207 in that order.

Data field 209 has a property value which is a property list consisting of data fields 210 through 213. Thus, data field 210 has the property name "Instance," data field 211 has the property name "Type," data field 212 has the property name "Value," and data field 213 has the property name "Connections," and a property value which is an ordered list containing data fields 214 and 215, in that order.

FIG. 3 is a diagram of data file 30 containing records 31 and 32 which are produced by a CAD program used to simulate the same integrated circuit as that of FIG. 1. To best understand the advantages of the present invention, assume that the same input data was used to produce data file 30 as was used to produce data file 10 of FIG. 1. By way of example, data file 30 consists of records produced by a revised version of a CAD circuit simulation program. FIG. 4 is an unordered list 400 showing a graphical representation of a hierarchical structure of the data file 30 of FIG. 3 after it has been parsed into individual data fields 401 through 423. It should be noted that none of the data fields 401 through 423 has a property name.

Data field 401 has a property value which is a simple ordered list containing data fields 402 through 405 and 409 through 412, in that order. Data field 402 has the property value "Instance," data field 403 has the property value "A0," data field 404 has the property value "Connections," and data field 405 has a property value which is a simple ordered list containing data fields 406 through 408, in that order. Data field 406 has the property value "net1," data field 407 has the property value "net3," and data field 408 has the property value "net2." Data field 409 has the property value "Type," data field 410 has the property value "NAND," data field 411 has the property value "Delay," and data field 412 has the property value "10.0."

Data field 413 has a property value which is a simple ordered list containing data fields 414 through 417 and 420 through 423. Data field 414 has the property value "Instance," data field 415 has the property value "a1," data field 416 has the property value "Connections," and data field 417 has a property value which is a simple ordered list containing data fields 418 and 419. Data field 418 has the property value "net4," and data field 419 has the property value "net5." Data field 420 has the property value "Type," data field 421 has the property value "Capacitor," data field 422 has the property value "Value," and data field 423 has the property value "4.99."

FIG. 5 is a diagram showing the data flow when a first data file 51 is compared with a second data file 52 in accordance with the present invention. Data fields from first and second data files 51 and 52 are combined with control records from a control file 53 and communicated to the smart compare logic 55. When a mismatch between a data field from data file 51 and a data field from data file 52 are found, and the degree of mismatch is determined to be significant, a difference record is produced by smart compare logic 55. The difference records thereby generated are stored in a difference file 54 for further analysis.

Control file 53 contains a plurality of control records which contain mapping information for ensuring that only related data fields are compared, regardless of the order in which they appear in first and second data files 51 and 52, respectively. A data field from data file 51 is mapped to a corresponding data field from data file 52 prior to being compared. The mapping process can occur when first and second data files 51 and 52 are built, in which case the corresponding data fields are stored in the same sequence in the respective first and second data files 51 and 52. In an alternative method, a data field from first data file 51 is read and then, using mapping information in control file 53, the corresponding data field from data file 52 is retrieved before comparing in smart compare logic 55.

The control records also contain tolerance information for determining when differences between data fields are deemed to be significant. The tolerance information is associated with each data field in data files 51 and 52 and is provided to smart compare logic 55 along with the corresponding data fields. Tolerance information varies depending on the type of data contained in the data field. For example, tolerance information can consist of absolute or relative numerical tolerance when the data field has a property value of the integer type, or it can consist of a more complex rule for determining whether a matching property value is found in a corresponding simple unordered list, much like matching an element in a lookup table.

FIG. 6 is a difference file 600 showing the results of comparing the data fields from ordered list 200 of FIG. 2 with corresponding data fields from ordered list 400 of FIG. 4. To describe the generation of difference file 600, reference is made to FIGS. 2, 4 and 6 such that particular elements from the respective figures are described using their respective reference numbers. Difference file 600 is comprised of difference records 601 through 603.

It should be appreciated that establishing correspondences between data fields from ordered lists 200 and 400 depends on utilizing the knowledge which is available regarding the content of ordered lists 200 and 400. By way of example, a programmer would know in advance that the most meaningful comparison is made if the property value of data field 211, "Capacitor," is mapped and compared to the property value of data field 421, "Capacitor." The sequential, binary, field by field method of the prior art would instead compare data field 211 with data field 410, "NAND," with which data field 211 does not correspond. Because they compare such unrelated items, previous methods can generate large numbers of false errors.

The present invention reduces the number of such false errors by taking advantage of the fact that the respective structures and meanings of the data fields comprising ordered lists 200 and 400 are known and accessible. Rather than performing a sequential comparison of corresponding data fields, a control file (not shown) is produced which ensures that only data fields which correspond to each other are compared regardless of their order or structure. The control file contains both mapping information and tolerance or screening criteria. The mapping information can consist of pointers which associate each data field in ordered list 200 with a corresponding data field in ordered list 400 such that the mapping information is used as each comparison is made. Alternatively, mapping information can be used to reorder or transform ordered lists 200 and 400 such that the data field comparisons can be made in sequence.

Data field 201 is mapped to data field 401 because they both represent parameters of the same element of the integrated circuit. Data field 201 has a property value which is a property list, whereas data field 401 has a property value which is a simple ordered list. A control file will contain information which allows the data field 401 to be mapped to a property list similar to date field 201. The comparison can then be done on a property by property basis.

Unordered list 400 is structured as a simple unordered list which is mapped into property name/property value pairs. For example, data field 402 is treated as a property name and data field 403 is treated as an associated property value. Accordingly, data field 202 is checked by finding a data field from converted unordered list 400 which has a property "Instance." Because data field 402 has such a value, data field 202 is mapped to data fields 402 and 403, such that the property name of data field 202 is compared with data field 402 and the property value of data field 202, i.e., "A0," is compared with the property value of data field 403, i.e., "A0." The respective property values match, so a difference record is not produced as a result of this comparison.

Data field 203 is mapped to data fields 409 and 410 because the property name of data field 203, i.e., "Type," matches the property value of data field 409, i.e., "Type." Prior methods which do not use such mapping would produce a difference record because they would compare, for example, the property value of data field 203 with the next sequential data record from ordered list 400, which is data field 403. Clearly, comparing the property value of data field 405 with that of data field 203 has no meaning in the context of the subject integrated circuit's parameters. Because the method of the present invention is able to establish a correspondence between data field 203 and data fields 409 and 410, a more meaningful comparison is made. Thus, the property value of data field 203, "NAND," is compared with the property value of data field 410, "NAND." Because they match, no difference record is produced.

Similarly, the simple ordered list which is the property value of data field 204 and which comprises data fields 205, 206 and 207, is mapped to data field 405, whose property value is a simple ordered list consisting of data fields 406, 407 and 408. Because the respective property values of data fields 407 and 408 are in reverse order from those of data fields 206 and 207, the programmer should determine whether the order of these data fields is significant. If not, the tolerance applied to the comparison can include a rule whereby each property value of data fields 205, 206 and 207 should appear in at least one of the data fields 406, 407 and 408 in order to not produce a difference record. Assume, however, that the order is important. Then the tolerance applied to the comparison of the property values of data field 405 with that of data field 204 would so state, and difference records 601 and 602 are produced and stored in difference file 600. Each difference record contains text indicating the nature of the difference found. For example, difference record 601 contains the text "List: Top->A0->Connections elements are different in file A: net2 and B: net3." Difference record 602 contains the text "List: Top->A0->Connections elements are different in file A: net3 and B: net2."

Data field 208 is mapped to data fields 411 and 412. The property value of data field 208, "1.0," is compared to the property value of data field 412, "10.0." The difference is generated as a match record which is compared to a corresponding tolerance. If the desired tolerance is a relative tolerance of, say, ten percent, then the property values of data fields 208 and 412 must be within ten percent of each other or else a difference record is produced. In this case, the respective property values are not within the desired tolerance, so that a difference record 603 is produced and stored in difference file 600. Difference record 603 contains the text "Property: Top->A0->Delay has different values in file A: 1.0, and B: 10.0."

Data field 209 is mapped to data field 413 because it represents the same circuit element. Even though the property value of data field 209 is a property list and the property value of data field 413 is a simple ordered list, data field 413 can be converted to, or treated as, a property list so that a difference record is not produced. Data field 210 is mapped to the property name/property value pair contained in data fields 414 and 415 by using the property name of data field 210, i.e., "Instance," to find a comparable data field in ordered list 400. The property values of data fields 210 and 415 do not match because data field 210 uses an uppercase letter and data field 415 uses a lowercase letter. However, assuming this difference was not significant, a tolerance could be set which instructed the smart compare logic to ignore the case when comparing these data fields. Thus, no difference record is produced.

Data field 211 is mapped to data fields 420 and 421 using the property name of data field 211 as a keyword for searching for a matching property value in ordered list 400. Because the property values of data fields 211 and 421 match, a difference record is not produced.

Data field 212 is mapped to data fields 422 and 423 based on the property name of data field 212. When the property value of data field 212 is compared with the property value of data field 423, the match record indicates a mismatch because the respective property values are not identical. However, if the mismatch were not deemed to be significant a relative tolerance of, say ten percent could be specified, in which case a difference record would not be produced because the mismatch fell within the specified tolerance.

Data field 213 is mapped to data field 417. Because the data fields which comprise the property values of the simple ordered lists of data fields 213 and 417 match, a difference record is not produced. Thus, difference file 600 which is produced using the method of the present invention contains fewer difference records than the prior art. The improvement is possible because knowledge of the structure and content of the ordered lists 200 and 400 is used to allow corresponding records to be compared, thereby eliminating meaningless comparisons, and screening out insignificant differences. The method of the present invention is more flexible than prior methods because it is capable of intelligent comparisons regardless of the order of the records or their position in the hierarchy of a data file.

The tolerance records contained in the control file define when a difference between data fields is significant, thereby eliminating insignificant differences from being stored in difference file 600. Tolerances can be globally or individually specified, or can be defined for a range of records, and are broadly defined to include any kind of screening criteria which is meaningful in light of a particular data type. For example, a tolerance can define an absolute or relative degree of matching between numerical property values, e.g., ten volts or ten percent. If the difference between compared property values is less than the tolerance given in the control file, a difference record is not generated.

The flexibility of the present invention as a diagnostic tool is enhanced by its ability to specify tolerances which screen for similarities as well as differences. The control file can provide for global tolerances which can be overridden by setting a different individual tolerance for any data field or for any branch in the hierarchical structure, including lists. A different tolerance can then be set for other branches. The ability to apply global or regional tolerances simplifies generation of the control file and allows for monitoring more critical aspects of the integrated circuit design more closely.

Screening criteria are not only applicable to real variables and integer variables, but can be defined for other types of property values as well. For example, string variables can be compared using wild cards and with case sensitivity or insensitivity, as desired. A list variable can point to a lookup list or table such that a match is found whenever a property value is equal to any member of the list. A control file can provide that no comparison be made at all for certain records such as, for example, the time and date on which ordered lists 200 and 400 were produced.

Figure 7:
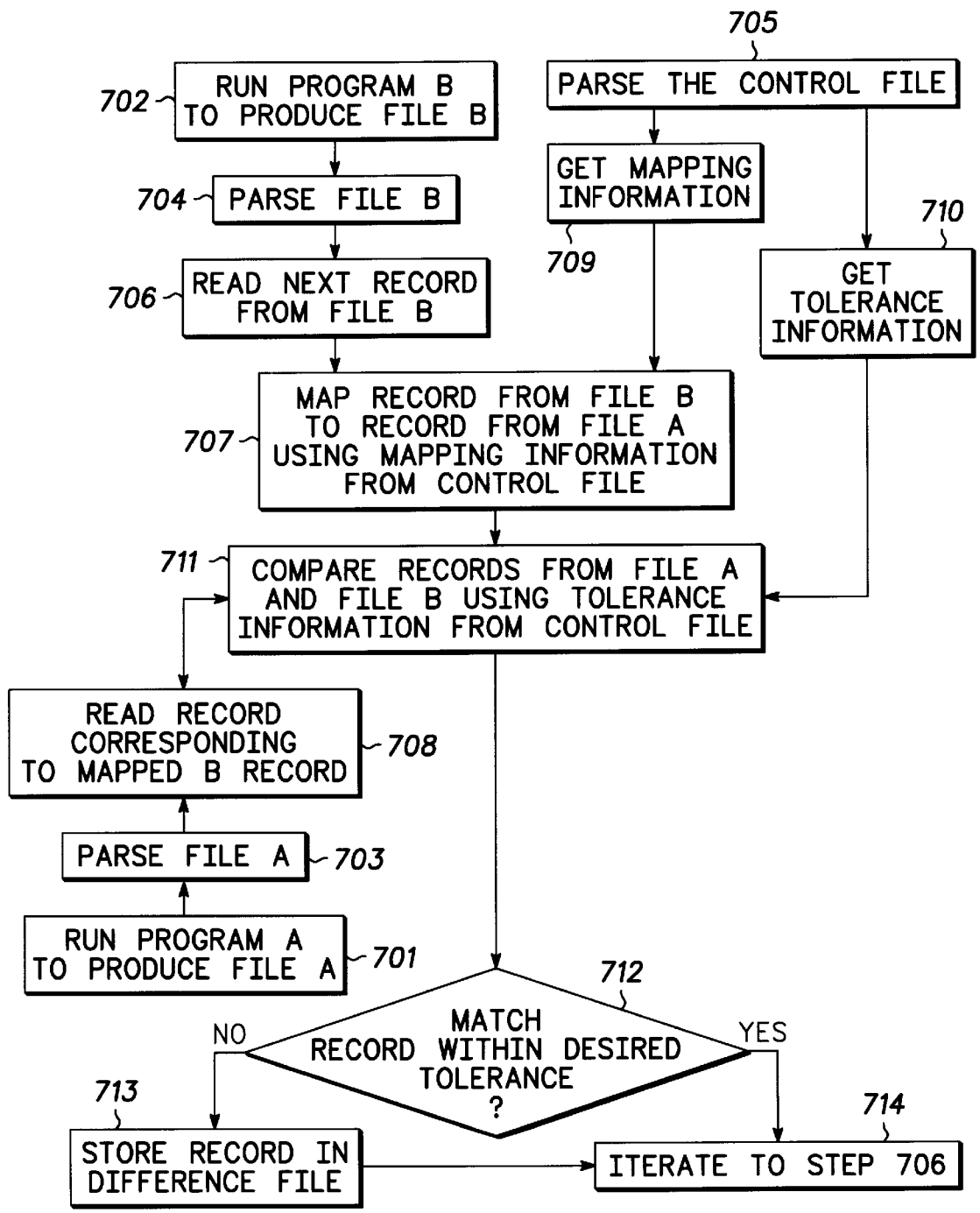
FIG. 7 is a flow chart of a smart compare method in accordance with the present invention.

FIG. 7 is a flow chart of a smart compare method in accordance with the present invention. The smart compare method uses a computer to compare each record from a file A with a corresponding record from a file B. The steps for implementing the method are typically stored in a computer readable storage medium such as a floppy disk, hard disk, compact disk, or magnetic tape.

At steps 701 and 702, file A and file B are respectively produced by computer programs A and B. The separate computer programs are generally related such that if they do not contain programming or data errors they will produce the same output records when they are run using the same input data. For example, file A can be produced by an existing version of a CAD program and file B can be produced by a revised version or replacement for the CAD program. Because of the symmetrical method of the present invention, file B can be produced by an existing version of a CAD program and file A can be produced by a revised version or a replacement program. Each record contained in files A and B contains a property value having a particular variable type, such as floating point, integer, string or list, and a record may contain a property name which can be used to further describe the property value.

At steps 703 and 704, file A and file B are respectively parsed. The parsing step organizes each file by structuring its records into a hierarchy or tree structure in order to provide more efficient program execution and data analysis and to provide for easier traversal for searching its contents. Files A and B can be independently parsed, so that step 703, the parsing step for file A, does not impose a limitation on step 704, the parsing step for file B. The present invention thus improves on prior methods by allowing files A and B to have different structures which can be optimized independently in accordance with the respective programs which produced them. For example, if an existing version of a CAD program produces a file A with a particular structure so that the existing version will execute more efficiently, the present invention does not limit its ability to do so. Similarly, file B could be structured differently from file A because a method for achieving faster execution designed into the revised CAD program requires such a structure. The present invention does not restrict such improvements.

At step 705, a control file is parsed. As with steps 703 and 704, the control file is parsed in order to provide a structure for its records and to promote execution and data handling efficiency. It is parsed independently from files A and B and need not conform to either of their data structures. The control file contains a set of mapping records, each of which essentially consists of a pointer which links or associates a record from file B to a corresponding record from file A. For example, if a file B record contains a property value which represents the value of a resistor in a circuit, the corresponding mapping record would point to the file A record which contains the value of that resistor. Mapping ensures that, for example, the resistor record from file B is compared with corresponding resistor record from file A, and not with a capacitor record. Mapping occurs regardless of where in the sequence the file A record might be and regardless of where corresponding records are positioned in their respective hierarchies. It thus provides an order-independent method for associating file B records with corresponding file A records. On record in the control file can affect many records of the files to be compared. For example, a tolerance could be specified which is applicable to all capacitors in the circuit.

Various methods for generating mapping records are used. Where file A records and file B records contain identical property names, the mapping records can be produced by matching respective property names from files A and B. Where property names are not used, they can be assigned by the CAD program using information relating to the file A and file B hierarchies which is contained in the respective versions of the CAD program or the parsing program, or they can be inferred based on the data structure and data in the control file.

Thus, mapping between files A and B associates each record from file B with a record from file A and with a mapping record from the control file. A fourth record, a tolerance record, is also associated with these records and is also typically stored in the control file. Tolerance records contain threshold information which defines when a difference is considered to be insignificant. Screening criteria contained in tolerance records take on characteristics appropriate to the type of property value being compared.

Broadly speaking, tolerance records contain rules designed to provide more flexible screening of data. They are typically under the control of the programmer who is looking for programming or data errors by identifying errors produced in the output. A separate and unique tolerance can be set for particular records if the programmer determines that such a high level of detail and intervention is desirable.

At step 706, a record is read from file B. Any convenient record can be selected, such as the next record stored in memory or, if file B is organized as a stack, a record from the top of a stack. At step 709, a mapping record is retrieved from the control file. At step 707, the file B record is mapped to a file A record by referring to the corresponding mapping record retrieved from the control file. The file A record is then read (step 708). At step 710, the corresponding tolerance record is retrieved from the control file.

At step 711, the file B record is compared with its corresponding file A record using the tolerance record retrieved at step 710. A difference is reported at step 712 when corresponding records are not within the desired tolerance of each other. One way to implement step 711 is to first compare the file B record with the corresponding file A record to produce a match record which corresponds to the difference between the file B and mapped file A records. The match record thus indicates whether there is a match and, if not, the kind and amount of difference detected. A second comparison between the match record and the tolerance record can be included in step 711. At step 712, a difference record is produced whenever the match record falls outside the desired tolerance.

For convenience, the difference records are saved in a difference file until examined. The procedure then iterates (step 714) back to step 706 with the reading of a new record from file B. When all the records from file B have been processed, the difference records are examined to determine whether they are generated by programming or data errors or whether they are false errors which can be discarded. If generated by programming or data errors, the difference records can provide clues for tracing the source of the errors. Once the source is identified, the program can be further revised to correct the errors.

If there are few false errors indicated by the difference records, they are simply ignored. However, if a large portion of the difference records contain false errors their number is further reduced by refining an appropriate portion of the tolerance records. Setting tolerances for comparing file A to file B is generally a recursive process which is used for focusing the error analysis on ever smaller amounts of data.

Figure 8:
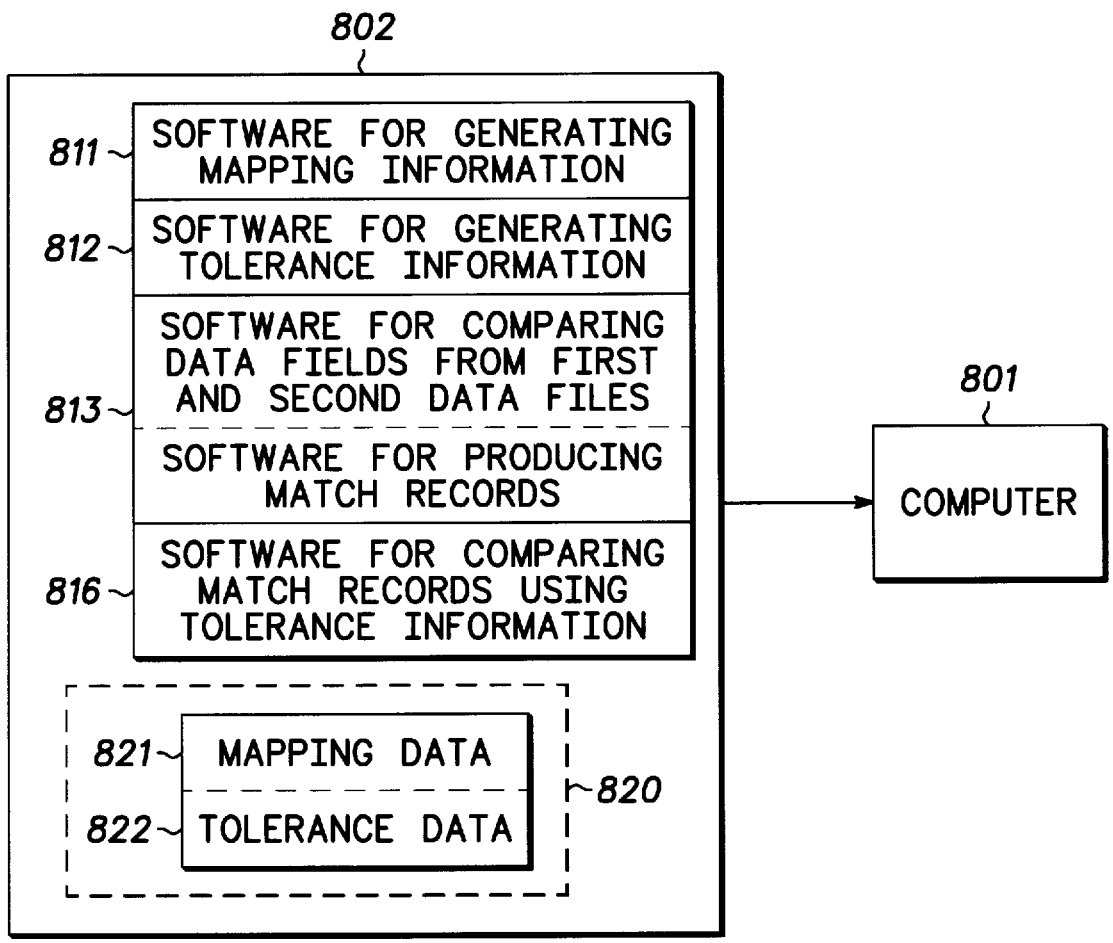
FIG. 8 is a computerized smart compare tool used for identifying errors either in revised input data or in a revised computer program.

FIG. 8 is a computerized smart compare tool 800 which is used to identify errors either in input data or in a computer program. The errors are traced by finding significant differences between first and second data files which are typically produced by existing and revised versions, respectively, of the input data or computer program. Smart compare tool 800 comprises a computer 801 and a computer readable storage medium 802 which can include a floppy disk, hard disk, compact disk, or magnetic tape or combinations thereof. Storage medium 802 can also include random access and read-only memory which is typically contained in computer 801.

Storage medium 802 contains regions of memory which contain the various software programming instructions for executing a smart compare program. It can also contain regions of memory for storing information produced when the smart compare program is executed. The various regions of memory are connected by pointers in the software programming instructions as is well known in the art.

In particular, a first region of memory 811 contains software for producing mapping data which associates corresponding data fields from the first and second data files. A second region of memory 812 contains software for producing tolerance data such that the tolerance data contains a desired tolerance for each corresponding data field from the first and second data files. A third region of memory 813 contains software for comparing the corresponding data fields from the first and second data files. A portion of the third region of memory 813 contains software instructions is for producing a plurality of match records representing differences between corresponding data fields from the first and second data files. A control file 820 comprises a fourth region of memory 821 for storing mapping data and a fifth region of memory 822 for storing tolerance data. A sixth region of memory 816 contains software instructions for comparing each match record to a corresponding tolerance such that a difference record is produced when a match record falls outside the desired tolerance.

By now it should be appreciated that a smart compare method and tool are provided for identifying significant differences between versions of a CAD program. The method improves on previous methods by identifying more precisely which output data was produced by the programming errors and which data contains false errors so that program corrections can be made more efficiently. By mapping output records produced by different versions of the CAD program, the smart compare method allows a programmer more freedom than with other methods to change the structure and organization of data produced by an updated CAD program. Program enhancements are thereby more readily incorporated into the CAD program.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, the present invention has been described as embodied in a CAD system. However, it could also be incorporated for use in developing other systems, such as employee data bases, which generate large quantities of diverse types of data.

We claim:

1. A computerized smart compare tool for finding significant differences between first and second data files, comprising:

a storage medium having a set of program instructions for executing a smart compare program, comprising:
      a first region of memory for producing mapping data between the first and second data files, wherein the mapping data associates corresponding data fields from the first and second data files;
      a second region of memory for producing tolerance data, wherein the tolerance data includes desired tolerances of the corresponding data fields; and
      a third region of memory for comparing the corresponding data fields from the first and second data files.

2. The smart compare tool of claim 1, the storage medium further comprising:

a fourth region of memory for storing the mapping data in a control file; and
   a fifth region of memory for storing the tolerance data in the control file.

3. The smart compare tool of claim 2, wherein a portion of the third region of memory is for producing match records mapped to corresponding desired tolerances of the tolerance data and representing differences between the corresponding data fields from the first and second data files, further comprising a sixth region of memory for comparing the match records to the corresponding desired tolerances, wherein difference records are produced when the match records fall outside the corresponding desired tolerances.

4. The smart compare tool of claim 3, wherein the storage medium is selected from the group consisting of compact disk, hard disk, floppy disk, and magnetic tape.

* * * * *